United States Patent
Hsiao

(10) Patent No.: US 9,196,322 B2
(45) Date of Patent: Nov. 24, 2015

(54) SEMICONDUCTOR MEMORY DEVICE THAT DOES NOT REQUIRE A SENSE AMPLIFIER

(71) Applicant: Chih-Cheng Hsiao, Taichung (TW)

(72) Inventor: Chih-Cheng Hsiao, Taichung (TW)

(*) Notice: Subject to any disclaimer, the term of this patent is extended or adjusted under 35 U.S.C. 154(b) by 79 days.

(21) Appl. No.: 14/186,227

(22) Filed: Feb. 21, 2014

(65) Prior Publication Data

US 2015/0016197 A1    Jan. 15, 2015

(30) Foreign Application Priority Data

Jul. 15, 2013  (TW) .............................. 102125228 A

(51) Int. Cl.
| | | |
|---|---|---|
| *G11C 7/00* | (2006.01) | |
| *G11C 7/02* | (2006.01) | |
| *G11C 5/14* | (2006.01) | |
| *G11C 7/06* | (2006.01) | |
| *G11C 11/4091* | (2006.01) | |
| *G11C 11/419* | (2006.01) | |

(52) U.S. Cl.
CPC ............ *G11C 7/067* (2013.01); *G11C 11/4091* (2013.01); *G11C 11/419* (2013.01)

(58) Field of Classification Search
CPC .......... G11C 5/14; G11C 5/145; G11C 5/148; G11C 5/147; G11C 2207/2227; G11C 7/00; G11C 7/02
See application file for complete search history.

(56) References Cited

U.S. PATENT DOCUMENTS

| | | |
|---|---|---|
| 3,646,525 A | 2/1972 | Linton et al. |
| 5,473,574 A | 12/1995 | Clemen et al. |
| 5,828,618 A | 10/1998 | Hosotani et al. |
| 6,570,792 B2 | 5/2003 | Fujimoto |
| 6,882,555 B2 | 4/2005 | Fenstermaker et al. |
| 7,196,942 B2 * | 3/2007 | Khurana ............... G11C 7/1051 326/38 |
| 7,626,850 B2 * | 12/2009 | Branch ................. G11C 11/412 365/154 |
| 7,835,175 B2 | 11/2010 | Wang |
| 8,742,811 B2 | 6/2014 | Umezaki |

(Continued)

FOREIGN PATENT DOCUMENTS

| | | |
|---|---|---|
| CN | 1825767 A | 8/2006 |
| CN | 101727959 A | 6/2010 |

(Continued)

OTHER PUBLICATIONS

Official Action and Search Report issued Jan. 29, 2014, by the Taiwan Intellectual Property Bureau in corresponding Taiwan Patent Application No. 102125228, with English translation (6 pages).

(Continued)

*Primary Examiner* — Hien Nguyen
(74) *Attorney, Agent, or Firm* — Osha Liang LLP

(57) ABSTRACT

A semiconductor memory device that does not require a sense amplifier includes a memory cell group having at least one memory cell, a buffer unit, and a bias voltage unit. The buffer unit includes a tri-state buffer that has an input terminal coupled to the memory cell group, and an output terminal coupled to a data line unit. The tri-state buffer is operable to switch between a conducting state and a non-conducting state. The bias voltage unit controls supply of a preset bias voltage to the input terminal of the tri-state buffer. By using the tri-state buffer, the parasitic capacitance attributed to the memory cell can be reduced, such that no sense amplifier is required to ensure proper operation, thereby reducing power consumption.

27 Claims, 13 Drawing Sheets

(56) References Cited

U.S. PATENT DOCUMENTS

| | | |
|---|---|---|
| 8,913,440 B2 | 12/2014 | Tao et al. |
| 2004/0257860 A1* | 12/2004 | Fenstermaker ...... G11C 11/419 365/156 |
| 2006/0186921 A1 | 8/2006 | Chen et al. |
| 2006/0203587 A1 | 9/2006 | Li et al. |
| 2007/0047292 A1 | 3/2007 | Berthold et al. |
| 2008/0259698 A1 | 10/2008 | Ozbek et al. |
| 2010/0091585 A1 | 4/2010 | Wang |
| 2013/0088926 A1 | 4/2013 | Tao et al. |
| 2014/0110731 A1 | 4/2014 | Umezaki |
| 2014/0362649 A1* | 12/2014 | Hsiao ...................... 365/189.05 |

FOREIGN PATENT DOCUMENTS

| | | |
|---|---|---|
| CN | 101877584 A | 11/2010 |
| EP | 0977204 A1 | 2/2000 |
| JP | 2012-174306 A | 9/2012 |
| TW | 200739603 | 10/2007 |
| TW | 200739603 A | 10/2007 |
| TW | 201015580 A | 4/2010 |
| TW | 201015580 A1 | 4/2010 |

OTHER PUBLICATIONS

Notice of Allowance issued Apr. 28, 2014, by the Taiwan Intellectual Property Bureau in corresponding Taiwan Patent Application No. 102125228, with English translation (4 pages).

Extended European Search Report dated Oct. 21, 2014, issued by the European Patent Office in related European Patent Application No. 14176818.4 (11 pages).

Sharroush, S. M., et al., "Dynamic random-access memories without sense amplifiers"; Elektrotechnik & Informationstechnik, vol. 129, No. 2, Feb. 1, 2012; XP035040935, ISSN: 1613-7620, DOI: 10.1007/S00502-012-0083-3; pp. 88-101.

Office Action issued in corresponding Taiwanese Application No. 102120736 dated Aug. 12, 2015, and English translation thereof (2 pages).

Office Action issued in corresponding U.S. Appl. No. 14/300,736 dated Sep. 15, 2015 (42 pages).

* cited by examiner

SEMICONDUCTOR MEMORY DEVICE THAT DOES NOT REQUIRE A SENSE AMPLIFIER

CROSS-REFERENCE TO RELATED APPLICATION

This application claims priority of Taiwanese Application No. 102125228, filed on Jul. 15, 2013.

BACKGROUND OF THE INVENTION

1. Field of the Invention

The invention relates to a memory device, more particularly to a semiconductor memory device that does not require a sense amplifier.

2. Description of the Related Art

FIG. 1 illustrates a conventional semiconductor memory device. The semiconductor memory device includes a memory cell group, a plurality of parallel data lines 11 connected to the memory cell group, a plurality of parallel control lines 12 connected to the memory cell group, and a plurality of sense amplifiers 14.

The memory cell group includes a plurality of memory cells 13. The control lines 12 intersect the data lines 11, and are electrically isolated from the data lines 11. The control lines 12 transmit a control signal to the memory cells 13, in order to control the memory cells 13 to output the data stored therein.

However, as the demand for capacity of the memory device increases, a memory cell group 10 with much more memory cells 13 may be preferable. The data lines 11 that are coupled to the memory cells 13 are subsequently made longer, which inevitably increases their parasitic capacitance.

Because of the parasitic capacitance of the data lines 11, a voltage that is outputted by the memory cells 13 may not be promptly propagated to the data lines 11 (i.e., the memory cells 13 may not be able to "drive" the data lines 11 efficiently). As a result, the sense amplifiers 14 are employed to assist in amplifying the voltage on the data lines 11, in order to facilitate data transmission and allow the semiconductor memory device to operate under a higher frequency.

Nonetheless, the sense amplifiers 14 may be undesired components of the semiconductor memory device due to their relatively large power consumption. Therefore, it may be beneficial to attempt to address the issue of the parasitic capacitance of the data lines, and to omit the sense amplifiers 14 altogether.

SUMMARY OF THE INVENTION

Therefore, the object of the present invention is to provide a semiconductor memory device that may alleviate at least one of the above drawbacks, and that does not require a sense amplifier.

According to one aspect, a semiconductor memory device of the present invention comprises a memory cell array, a data line unit, a control unit, a buffer unit, and a bias voltage unit.

The memory cell array includes a plurality of memory cell groups, each of the memory cell groups including at least one memory cell. The data line unit is coupled to the memory cell groups and includes a plurality of spaced-apart and electrically isolated data lines for transmitting to-be-read data and to-be-written data.

The control unit is coupled to the memory cell groups, is electrically isolated from the data line unit, and is for transmitting a control signal.

The buffer unit includes a plurality of the tri-state buffers. Each of the tri-state buffers has an input terminal coupled to the at least one memory cell, and an output terminal coupled to the data line unit. The tri-state buffers are controlled to switch between a conducting state and a non-conducting state.

The bias voltage unit coupled to the input terminal of each of the tri-state buffers to supply a preset bias voltage to the input terminals of the tri-state buffers.

According to another aspect, a semiconductor memory device of the present invention comprises a memory cell array, a data line unit, a control unit, a logic unit, and a bias voltage unit.

The memory cell array includes a plurality of the memory cell groups, each of the memory cell groups includes at least one memory cell. The data line unit is coupled to the memory cell groups and includes a plurality of spaced-apart and electrically isolated data lines for transmitting to-be-read data and to-be-written data. The control unit is coupled to the memory cell groups, is electrically isolated from the data line unit, and is for transmitting a control signal.

The logic unit has a plurality of input terminals each coupled to at least one memory cell, and an output terminal coupled to the data line unit. Data stored in the memory cell groups is read through the data line unit via the logic unit.

The bias voltage unit is coupled to each of the input terminals of the logic unit to supply a preset bias voltage to the input terminals of the logic unit.

According to yet another aspect, a semiconductor memory device of the present invention is configured for use in a system having a system clock and a voltage source that provides a high voltage and a low voltage. The semiconductor memory device comprises a memory cell array, a data line unit, a control unit, and a bias voltage unit.

The memory cell array includes a memory cell group. The data line unit coupled to the memory cell group. The control unit is electrically isolated from the data line unit, and is for transmitting a control signal.

The bias voltage unit is coupled to a junction of the memory cell group and the data line unit is and operable to control supply of a preset bias voltage to the junction.

Preferably, the data line unit is configured such that a time constant thereof is smaller than that required by the system clock. Preferably, amplitude of a signal read through the data line unit corresponds in magnitude to a difference between the high voltage and the low voltage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
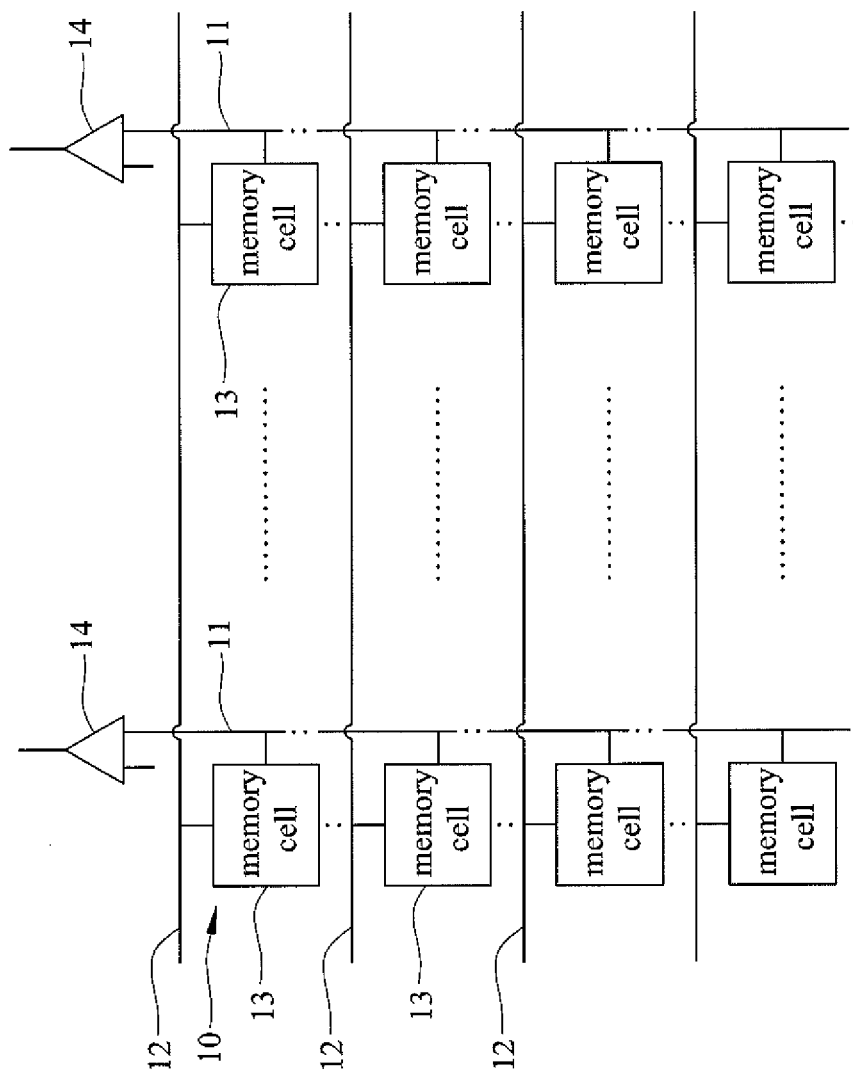
FIG. 1 is a schematic block diagram of a conventional semiconductor memory device.

Before the present invention is described in greater detail, it should be noted that like elements are denoted by the same reference numerals throughout the disclosure.

Figure 2:
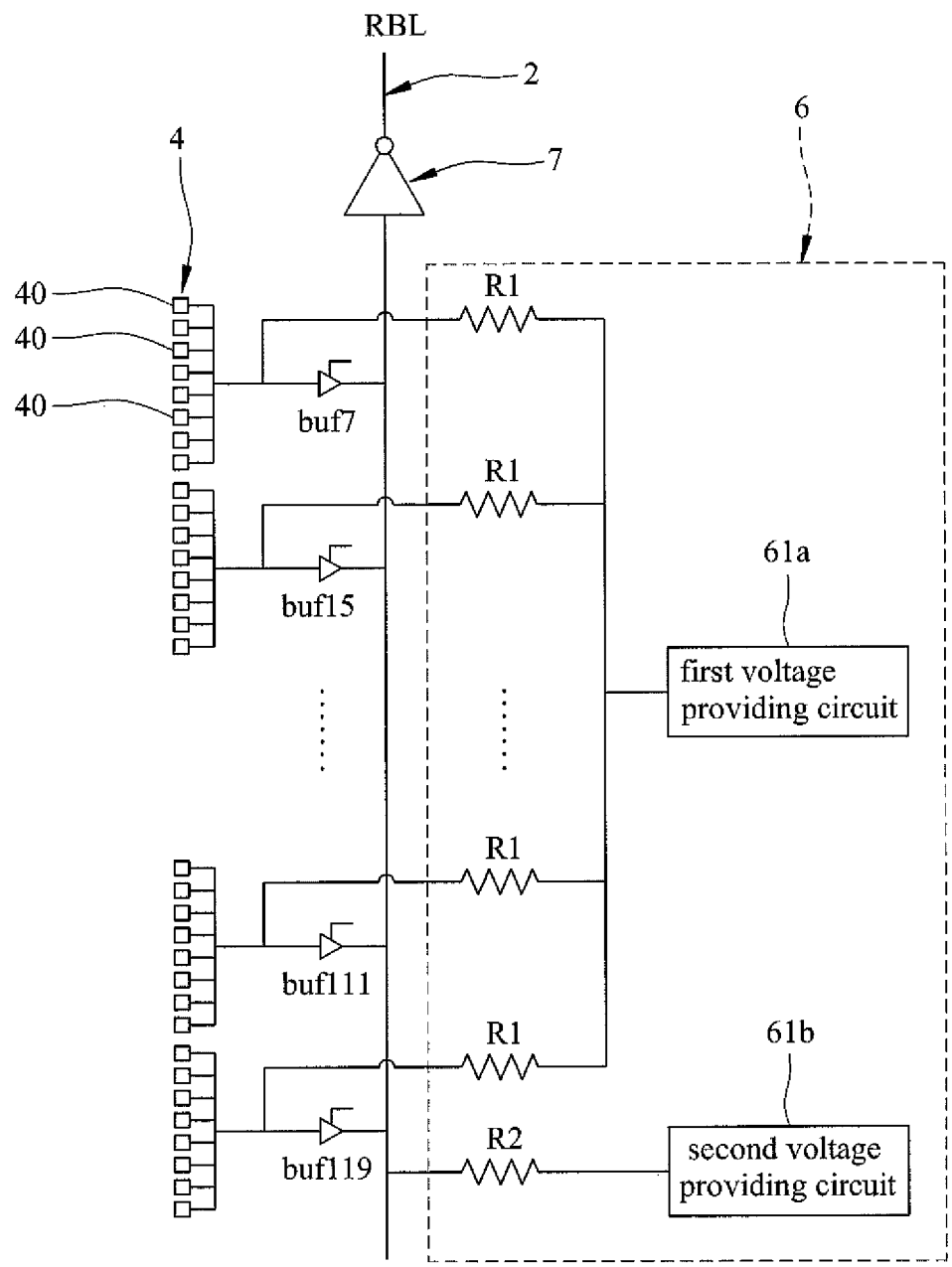
FIG. 2 is a schematic block diagram of the first preferred embodiment of a semiconductor memory device that does not require a sense amplifier, according to the invention.

As shown in FIG. 2, the first preferred embodiment of a semiconductor memory device according to the present invention may be configured for use in a system having a system clock and a voltage source that provides a high voltage (e.g., an operating voltage) and a low voltage (e.g., a ground voltage). The semiconductor memory device comprises a data line unit 2, a control line unit 3 (see FIG. 4), a plurality of memory cell groups 4, a buffer unit, a bias voltage unit 6, and an inverting unit 7.

The semiconductor memory device in the embodiments of this invention may be coupled to a processor such as a central processing unit (not depicted in the drawings), and can be accessed by the processor via a controller (not depicted in the drawings) to serve as, for example, a cache.

In this embodiment, a memory cell line that includes 16 memory cell groups 4 is presented. Each of the memory cell groups 4 may include one or more memory cells 40. For example, eight memory cells 40 are included in each of the memory cell groups 4.

Figure 4:
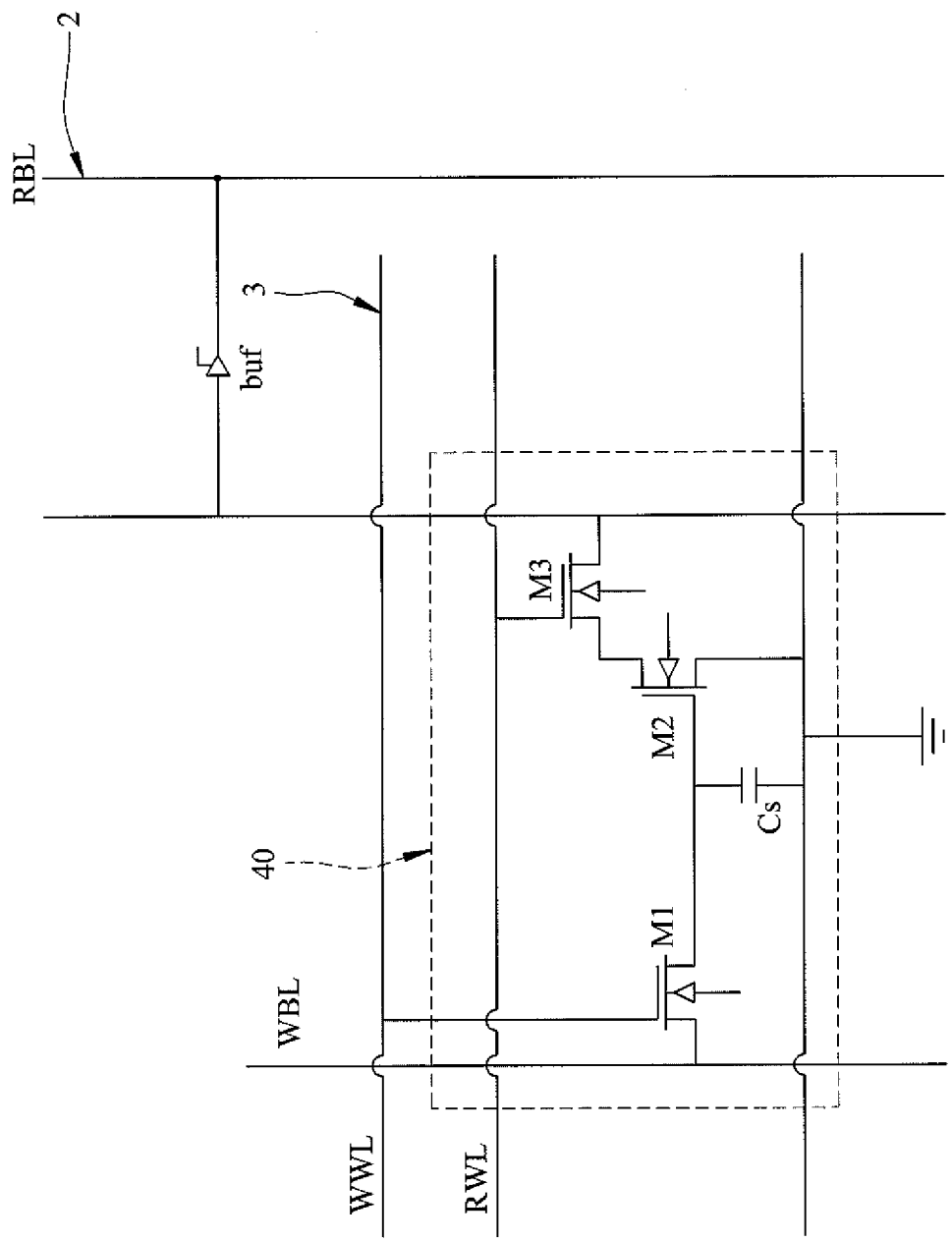
FIG. 4 is a schematic circuit diagram of a memory cell of the semiconductor memory device according to the first preferred embodiment.

The data line unit 2 is coupled to the controller and the memory cell groups 4, and includes a read bit line (RBL) and a write bit line (WBL) that are spaced apart and electrically isolated from each other, as best shown in FIG. 4.

In the embodiments, the read bit line (RBL) and the write bit line (WBL) are configured such that a time constant thereof may be sufficiently low for adequate operation in the system with the system clock.

Referring to FIG. 4, the control line unit 3 is coupled to the controller and the memory cell groups 4, and includes a read word line (RWL) and a write word line (WWL). The control unit 3 is for transmitting control signals including a read control signal and a write control signal, in order to configure the states of the memory cell groups 4.

In particular, the read bit line (RBL) is configured to transmit to-be-read data that is stored in the memory cells 40, and the write bit line (WBL) is configured to transmit to-be-written data to the memory cells 40. The read word lines (RWL) are configured to transmit the read control signal to the memory cells 40 for controlling the memory cells 40 to be readable/non-readable. The write word lines (WWL) are configured to transmit the write control signal to the memory cells 40 for controlling the memory cells 40 to be writeable/non-writeable.

Referring back to FIG. 2, the buffer unit includes a plurality of tri-state buffers (buf) (e.g., buf7, buf15, . . . , buf119, buf127, etc.). Each of the tri-state buffers (buf) has an input terminal coupled to the memory cell group 4, an output terminal coupled to the read bit line (RBL), and a control terminal that is to be coupled to a system control unit (not depicted in the drawings). The control terminal is for receiving a command signal from the system control unit, such that the tri-state buffer (buf) is operable to switch between a conducting state and a non-conducting state.

Figure 5:
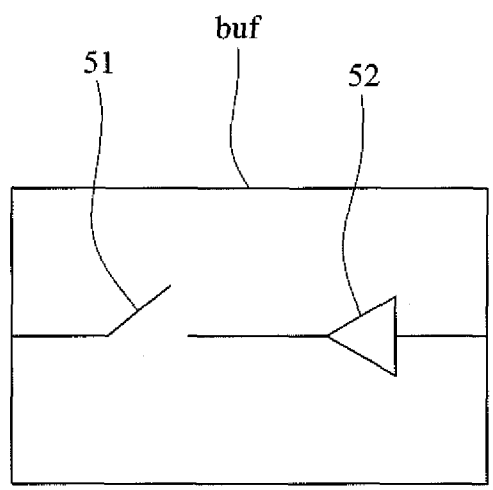
FIG. 5 is a schematic circuit diagram of an alternative of a tri-state buffer used in the first embodiment.

It is worth noting that, in some embodiments, the tri-state buffers (buf) may be embodied as other configurations that can be switched between a conducting state and a non-conducting state. For example, FIG. 5 illustrates one such configuration that includes a combination of a switch 51 and a buffer 52 connected in series.

In this embodiment, each of the memory cells 40 is a three-transistor dynamic random access memory (3T-DRAM) cell which is a volatile memory cell that employs n-type metal-oxide-semiconductor field-effect transistors (N-MOS transistors). However, various types of memory cells may be employed in other embodiments.

FIG. 4 illustrates one such memory cell 40 used in this embodiment. The memory cell 40 includes a first transistor ($M_1$), a second transistor ($M_2$), a third transistor ($M_3$), and a capacitor (Cs).

The first transistor ($M_1$) has a first terminal, a second terminal coupled to the write bit line (WBL), and a control terminal coupled the write word line (WWL).

The second transistor ($M_2$) has a first terminal, a second terminal disposed to receive a first voltage, and a control terminal coupled to the first terminal of the first transistor ($M_1$). In this embodiment where N-MOS transistors are used, the first voltage is a ground voltage.

The capacitor (Cs) has one end coupled to the control terminal of the second transistor ($M_2$), and another end disposed to receive the first voltage.

The third transistor ($M_3$) has a first terminal coupled to the input terminal of the tri-state buffer, a second terminal coupled to the first terminal of the second transistor ($M_2$), and a control terminal coupled to the read word line (RWL).

In operation, the first transistor ($M_1$) is controlled by the write word line (WWL) to switch between conducting and non-conducting states. That is, when the memory cell 40 is selected to have data written therein, the write word line (WWL) is subsequently set to a high voltage level (e.g., at the operating voltage), thereby switching the first transistor ($M_1$) to the conducting state.

The second transistor ($M_2$) is controlled by the electrical energy stored in the capacitor (Cs) to switch between conducting and non-conducting states. That is, when the capacitor (Cs) is sufficiently charged to provide a voltage higher than the threshold voltage of the second transistor ($M_2$), the second transistor ($M_{-2}$) will be switched to the conducting state.

The third transistor ($M_3$) is controlled by the read word line (RWL) to switch between conducting and non-conducting states. That is, when one of the memory cells 40 is selected so as to read the data stored therein, the corresponding read word line (RWL) is subsequently set to a high voltage level (e.g., at the operating voltage), thereby switching the third transistor ($M_3$) to the conducting state.

Figure 3:
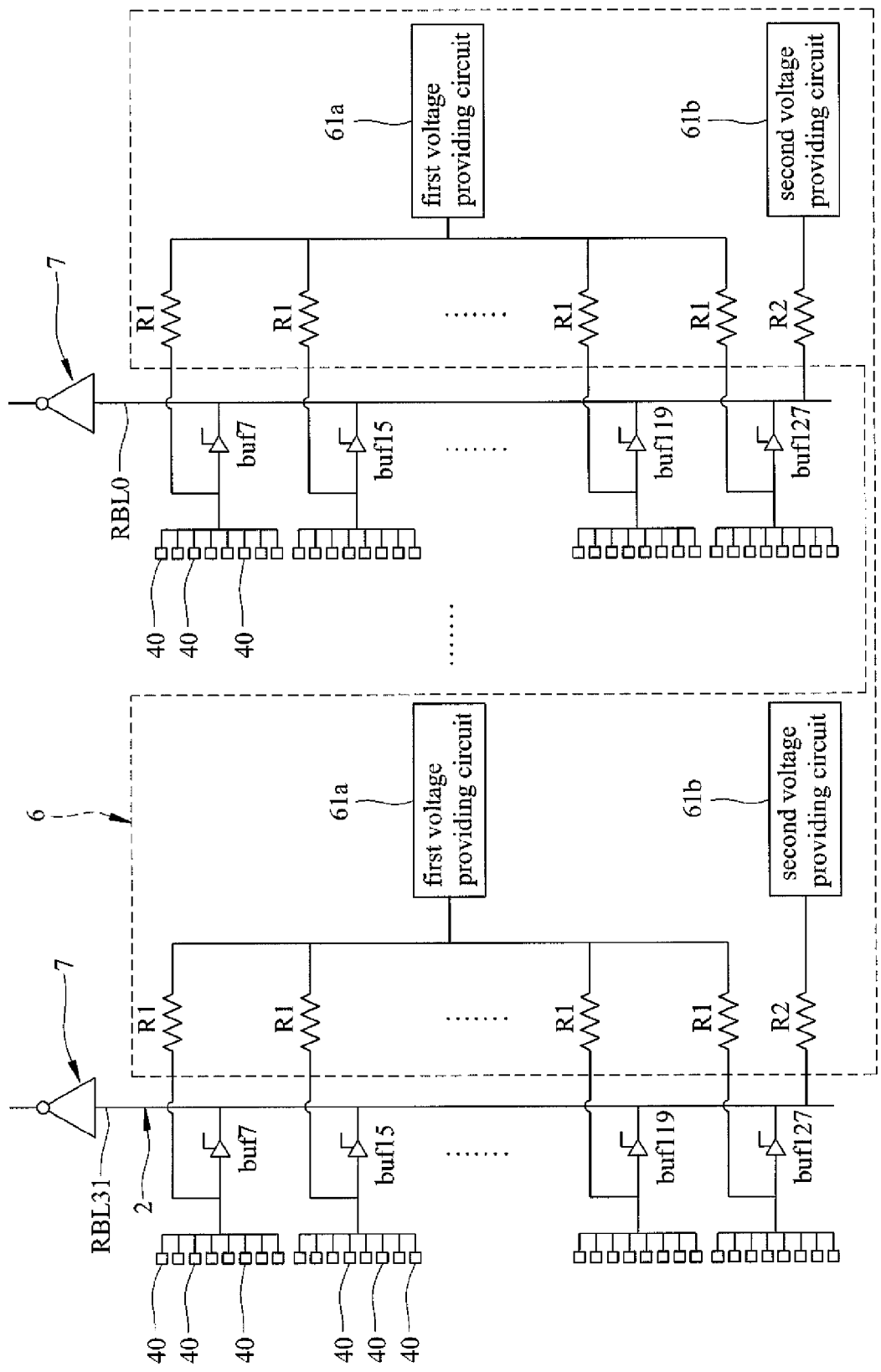
FIG. 3 is a schematic block diagram of the first preferred embodiment, where a plurality of memory cell lines are employed.

It is noted that, in other embodiments, various numbers of memory cell groups 4 and/or various size of each of the memory cell groups 4 may be employed to constitute a larger semiconductor memory device. For example, in one embodiment as shown in FIG. 3, 32 memory cell lines identical to that depicted in FIG. 2 are arranged, thus creating a 128*32 memory cell array.

Accordingly, the data unit 2 in this embodiment includes a plurality of read bit lines (RBL) (e.g., RBL0, RBL 31, etc.) and a plurality of write bit lines (WBL) that are disposed alternately with the read bit lines (RBL). For each of the memory cell lines, a plurality of the tri-state buffers (buf) are coupled between the memory cell groups 4 and the corresponding one of the read bit lines (RBL), and the bias voltage unit 6 is coupled to the input terminal of each of the tri-state buffers (buf).

Referring back to FIGS. 2 and 3, the bias voltage unit 6 is operable to control supply of a preset bias voltage to the input terminal of each of the tri-state buffers (buf).

In this embodiment, the bias voltage unit 6 is operable, with respect to each of the tri-state buffers (buf), to switch between a biasing mode, and a non-biasing mode. In the biasing mode, the preset bias voltage is supplied to the input terminals of each of the tri-state buffers (buf). In the non-biasing mode, the preset bias voltage is not supplied to the input terminals of each of the tri-state buffers (buf). In default, the bias voltage unit is kept in the biasing mode. When data is to be read from the memory cell groups 4, the bias voltage unit 6 is switched to the non-biasing mode.

In this embodiment, the bias voltage unit 6 includes a plurality of first resistors (R1), a second resistor (R2), a first voltage providing circuit 61a, and a second voltage providing circuit 61b.

Each of the first resistors (R1) is coupled to a respective one of the input terminals of the tri-state buffers (buf). The second resistor (R2) is coupled between the read bit line (RBL) and the second voltage providing circuit 61b. The first voltage providing circuit 61a is coupled to the first resistors (R1) for providing the preset bias voltage the input terminals of each of the tri-state buffers (buf) when the bias voltage unit 6 operates in the biasing mode. The second voltage providing circuit 61b is coupled to the read bit line (RBL) for providing the preset bias voltage thereto when the bias voltage unit 6 operates in the biasing mode.

While in this embodiment, one first voltage providing circuit 61a and one second voltage providing circuit 61b are employed, various configurations of the bias voltage unit 6 may be utilized in other embodiments. For example, a plurality of first voltage providing circuits 61a may be disposed to each couple to a respective one of the first resistors (R1). Alternatively, the second voltage providing circuit 61b may be omitted when implementation costs are to be taken into consideration. In such a case, the first voltage providing circuit 61a is also coupled to the second resistor (R2).

The first resistors (R1) and the second resistor (R2) may be embodied as poly resistor, transistor resistor, etc.

According to the configuration set forth in this embodiment (i.e., N-MOS transistors are used), the preset bias voltage is set to a high voltage level (e.g., at the operating voltage). Alternatively, when P-MOS transistors are used, the preset bias voltage may be set to a low voltage level (e.g., at the ground voltage).

The inverter 7 is disposed at an end of the read bit line (RBL) for obtaining an inverted voltage level of the to-be-read data.

Referring to FIG. 4, in operation, each of the memory cells 40 can be controlled by the control signals to operate in one of a write mode and a read mode. Generation of the control signals may be done by the controller that is coupled to the semiconductor memory device.

For example, when data is to be written into a selected one of the memory cells 40 (i.e., the memory cell 40 is to be switched to the write mode), the write control signal sets the write word line (WWL) to a high voltage level for switching the first transistor ($M_1$) to the conducting state. Afterwards, the write bit line (WBL) is able to transmit the to-be-written data to the first transistor ($M_1$) for subsequent storage in the capacitor (Cs).

Alternatively, when data is to be read from the selected one of the memory cells 40 (i.e., the memory cell 40 is to be switched to the read mode), the bias voltage unit 6 is switched to the non-biasing mode. This is to ensure that the input terminals of the tri-state buffers (buf) and the read bit line (RBL) are adjusted to the preset bias voltage. Afterward, the read control signal sets the read word line (RWL) to a high voltage level, in order to fetch the voltage level associated with the capacitor (Cs) of the selected one of the memory cells 40.

Moreover, the tri-state buffer (buf) that is connected to the selected one of the memory cells 40 is controlled to be in the conducting state, while other tri-state buffers (buf) are controlled to be in the non-conducting state. This is done because, when a tri-state buffer (buf) is in the conducting state, data read from the coupled memory cell 40 will be relayed to the read bit line (RBL). As a result, when multiple tri-state buffers (buf) are left conducting, there may be occurrence of undesired effects, such as errors due to non-selected data being read, and additional power dissipation. Therefore, it is necessary to ensure other tri-state buffers (buf) that are not coupled to the selected one of the memory cells 40 stay in the non-conducting state.

For example, when one memory cell 40 belonging to the memory cell group 4 that is coupled to the tri-state buffer (buf119) is selected, the third transistor ($M_3$) of the selected memory cell 40 outputs the to-be-read data to the tri-state buffer (buf119). Subsequently, the tri-state buffer (buf119) is switched to the conducting state, and other tri-state buffers (buf) remain in the non-conducting state. The result is that the voltage of the capacitor (Cs) being outputted to the read bit line (RBL), and then inverted by the inverter 7 before being transmitted to the controller.

Details of the read operation are as follows. For the selected one of the memory cells 40, when the capacitor (Cs) is discharged (i.e., the data stored in the memory cell 40 is '0'), the second transistor ($M_2$) is in the non-conducting state, and the first terminal of the third transistor ($M_3$) is in a high-impedance state. As a result, the voltage being fed to the read bit line (RBL) as the to-be-read data will be the voltage at the input terminal of the tri-state buffer (buf119), which has been adjusted to the preset bias voltage (high voltage level) by the bias voltage unit 6. After being inverted by the inverter 7, the voltage that correctly reflects the voltage of the capacitor (Cs) may be outputted to the controller.

On the other hand, when the capacitor (Cs) is charged (i.e., the data stored in the memory cell 40 is '1'), the second transistor ($M_2$) is in the conducting state, and the first terminal of the second transistor ($M_2$) is at the predetermined voltage (i.e., the ground voltage). The ground voltage is then fed to the corresponding read bit line (RBL). Similarly, after being inverted by the inverter 7, the voltage that correctly reflects the voltage of the capacitor (Cs) may be outputted to the controller.

It is evident from the above description that data read from the memory cell 40 alternates between the high voltage (the operating voltage) and the low voltage (the ground voltage), and therefore amplitude of a signal read through the read bit line (RBL) corresponds in magnitude to a difference between the high voltage and the low voltage.

It is known that, in conventional semiconductor memory devices, when a larger number of memory cell lines are incorporated, the parasitic capacitance and an effective resistance on each of the read bit lines (RBL) becomes relatively large and may adversely affect signal transmission efficiency on each of the read bit lines (RBL). For example, when a high voltage is to be transmitted via the read bit lines (RBL), the large parasitic capacitance and the effective resistance of the voltage read bit lines (RBL) may prevent the voltage from being pulled up to the correct high voltage. In such cases, a plurality of buffer amplifiers may be provided to connect in series with the read bit lines (RBL) respectively to address this issue.

However, due to the characteristic of the semiconductor memory device of this invention, the need for implementing a sense amplifier in cases of a large memory cell array may be eliminated.

Furthermore, using the design of this embodiment, the first voltage providing circuit 61a and the second voltage providing circuit 61b are cut off when data is to be read from the memory cells 40. This prevents creating a large voltage across the first and second resistors (R1) and (R2) when the to-be-read data is the inverted form of the preset bias voltage, and may reduce unnecessary power dissipation attributed to electrical current flowing through the first and second resistors (R1) and (R2).

Figure 6:
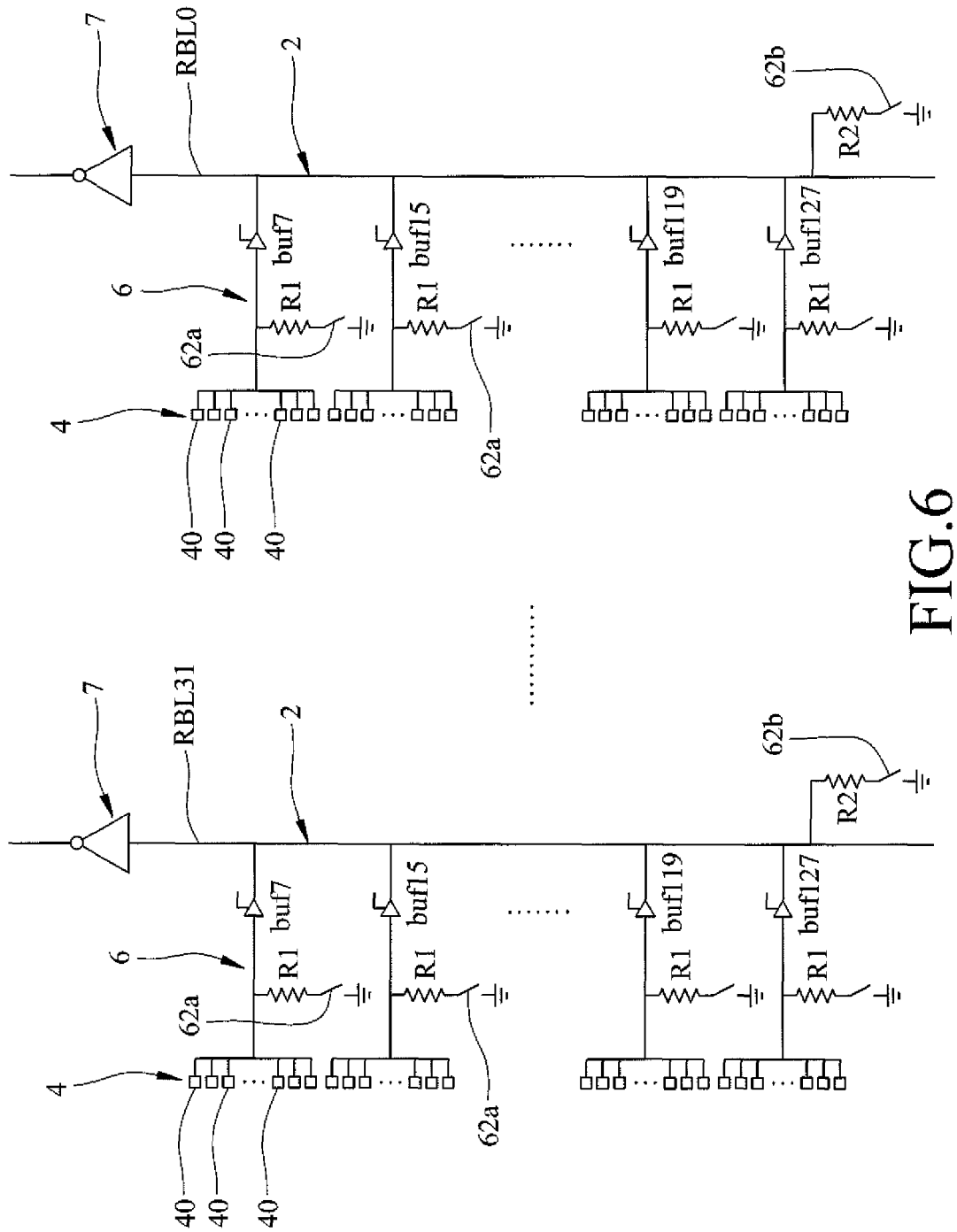
FIG. 6 is a schematic block diagram of a variation of the first preferred embodiment.

FIG. 6 illustrates a variation of the first preferred embodiment. For the sake of simplicity, only one memory cell line is described herein since this variation can be considered as a combination of a plurality (e.g., 32) of identical memory cell lines.

In this variation, P-MOS transistors are used to constitute the memory cells 40. Accordingly, the preset bias voltage is the low voltage (e.g., a ground voltage as shown in FIG. 6). Additionally, the bias voltage unit 6 includes a plurality of first resistors (R1), a second resistor (R2), a plurality of first switches 62a, and a second switch 62b.

Each of the first resistors (R1) is coupled to the input terminal of a respective one of the tri-state buffers (buf). The second resistor (R2) is coupled to the read bit line (RBL). Each of the first switches 62a is coupled between a respective one of the first resistors (R1) and the ground voltage source. The second switch 62b is coupled between the second resistor (R2) and the ground voltage source.

The first switches 62a and the second switch 62b are closed when the bias voltage unit 6 operates in the biasing mode, and are open when the bias voltage unit 6 operates in the non-biasing mode.

In brief, some of the advantages of this embodiment may be summarized as follows.

Instead of coupling each of the memory cells 40 to the read bit line (RBL), in this embodiment, for each of the memory cell lines, the 128 memory cells 40 are first arranged in groups of eight (making 16 memory cell groups 4) and coupled to the read bit line (RBL) via 16 tri-state buffers (buf). In this case, the parasitic capacitance attributed to the memory cells 40 can be reduced to 1/16 compared to the conventional configuration. With a substantially smaller parasitic capacitance and driving capability provided by the tri-state buffers (buf), the read bit line (RBL) does not require an additional sense amplifier to ensure proper operation, thereby reducing the power consumption dramatically. Moreover, the inclusion of the tri-state buffers (buf) allows the semiconductor memory device to operate in a higher clock frequency. For example, a semiconductor memory device that does not include the tri-state buffers (buf) may have a maximum operating frequency of 20 MHz, under which the semiconductor memory device functions normally. When the tri-state buffers (buf) are taken into consideration, the maximum operating frequency of the semiconductor memory device can be increased to 320 MHz.

The bias voltage unit 6 is operable to switch between the biasing mode and the non-biasing mode. When in the biasing mode, the input terminals of the tri-state buffers (buf) and the read bit line (RBL) are provided with the preset bias voltage, thereby preventing the input terminals from being in a floating state, which may induce large power consumption of the tri-state buffers (buf). Furthermore, by cutting off the first voltage providing circuit 61a and the second voltage providing circuit 61b when data is to be read from the memory cells 40, unnecessary power dissipation that is attributed to electrical current flowing through the first and second resistors (R1) and (R2) can be reduced.

Figure 7:
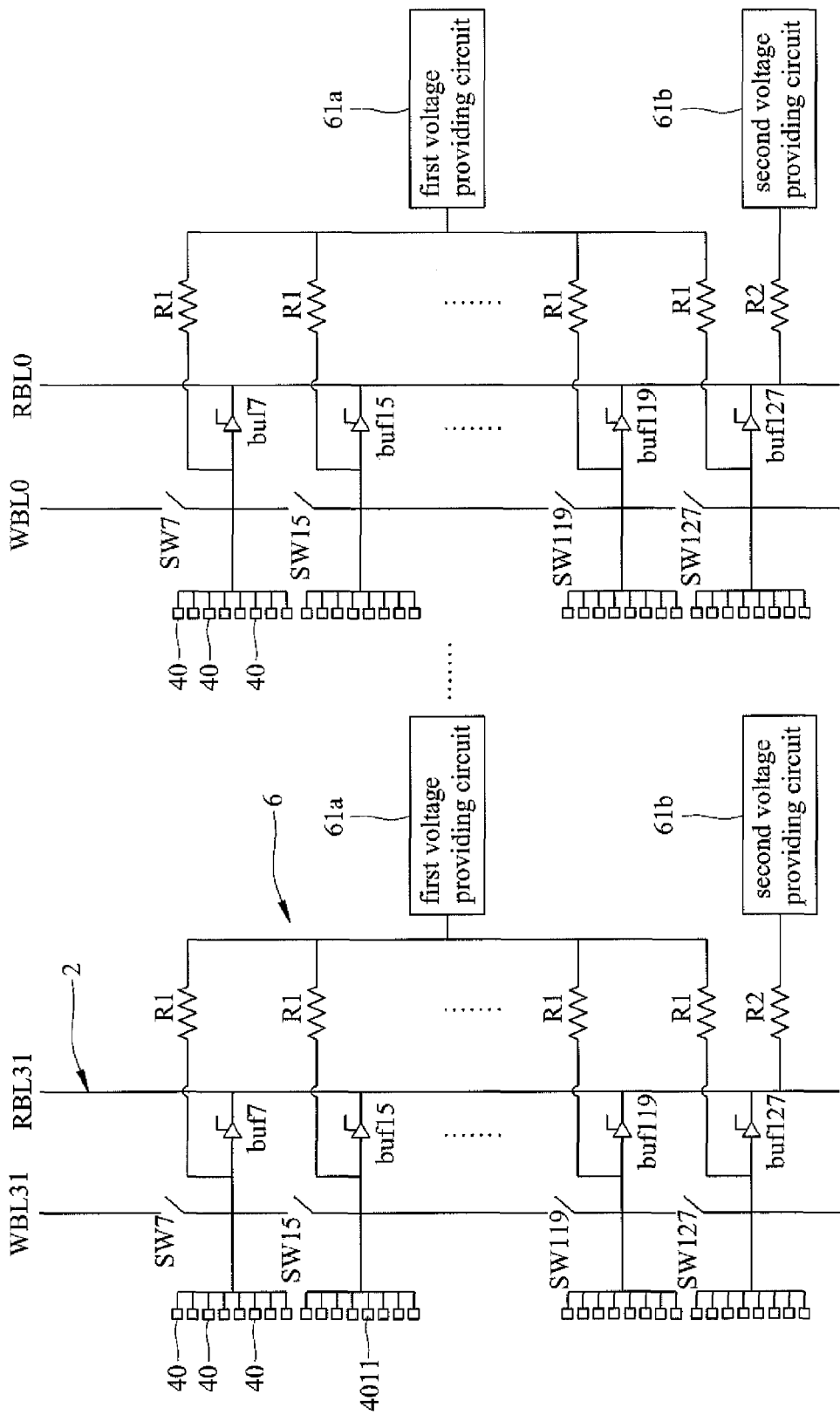
FIG. 7 is a schematic block diagram of the second preferred embodiment of a semiconductor memory device that does not require a sense amplifier, according to the invention.
Figure 8:
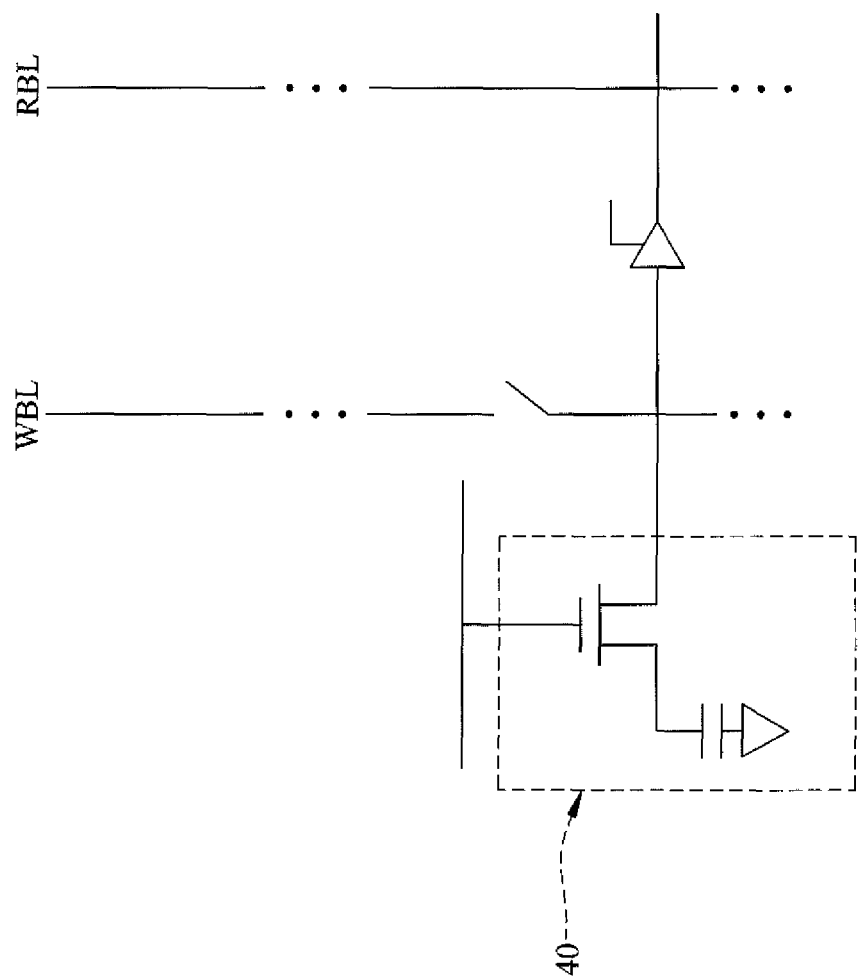
FIG. 8 is a schematic circuit diagram of a memory cell of the semiconductor memory device according to the second preferred embodiment.

As shown in FIGS. 7 and 8, the second preferred embodiment of the semiconductor memory device according to the present invention has a structure similar to that of the first embodiment. The main differences between this embodiment and the first preferred embodiment reside in the following.

The memory cells 40 in this embodiment are embodied as one-transistor dynamic random access memories (1T-DRAM) each including a transistor and a capacitor. In this case, the data read from the memory cells 40 have an identical phase as that transmitted to the read bit lines (RBL). Therefore, the semiconductor memory device of this embodiment does not require the inverters 7 of the semiconductor memory device of the first preferred embodiment.

The transistor of each of the memory cells 40 of this embodiment includes a control terminal, a first terminal coupled to the capacitor, and a second terminal. It is known that for the 1T-DRAMs, the second terminal is used for reading data therefrom and writing data thereto. As a result, the write bit line (WBL) and the read bit line (RBL) are both coupled to the second terminal. The tri-state buffer (buf) is coupled between the write bit line (WBL) and the read bit line (RBL).

For each of the memory cell lines, a plurality of buffer switches (SW, e.g., SW7, SW15, etc.) are connected in series on the write bit line (WBL). A common node of every adjacent pair of the buffer switches (e.g., SW7 and SW15) is connected to a respective one of the memory cell groups 4 and the bias voltage unit 6. The buffer switches (SW) are operable to switch between an open state and a closed state, and each of the buffer switches (SW) includes a first terminal connected to the data line unit 2 for receiving the to-be-written data, and a second terminal coupled to at least one of the memory cells 40.

In operation, when data is to be written into one of the memory cells 40, parts of the write bit line (WBL) between the one of the memory cells 40 and the controller must be configured to establish a closed circuit in order for the data to reach the one of the memory cells 40. For example, when it is intended to write data into the particular memory cell 4011, the buffer switches SW7 and SW15 must be closed. Alternatively, when data is to be read from one of the memory cells 40, all the buffer switches (SW) must be open.

Depending on requirements, the buffer switches (SW) may be embodied as normal switch components or tri-state buffers (buf) that have driving capability. In some embodiments, a driving circuit (not depicted in the drawings) may be incorporated at one end of each of the write bit lines (WBL) in order to decrease the time for driving the voltage thereon.

In this embodiment, the bias voltage unit 6 includes a plurality of first resistors (R1), a second resistor (R2), a first voltage providing circuit 61a, and a second voltage providing circuit 61b.

Each of the first resistors (R1) is coupled to a respective one of the input terminals of the tri-state buffers (buf) (that is, the common node of a respective one of adjacent pairs of the buffer switches (SW)). The second resistor (R2) is coupled between the read bit line (RBL) and the second voltage providing circuit 61b.

The first voltage providing circuit 61a is coupled to the first resistors (R1), and provides the preset bias voltage to the input terminals of each of the tri-state buffers when the bias voltage unit 6 operates in the biasing mode. The second voltage providing circuit 61b is coupled to the read bit line (RBL) via the second resistor (R2) for providing the preset bias voltage thereto when the bias voltage unit 6 operates in the biasing mode.

The bias voltage unit 6 is switched to the non-biasing mode when data is to be written into a selected one of the memory cell groups 4.

Figure 9:
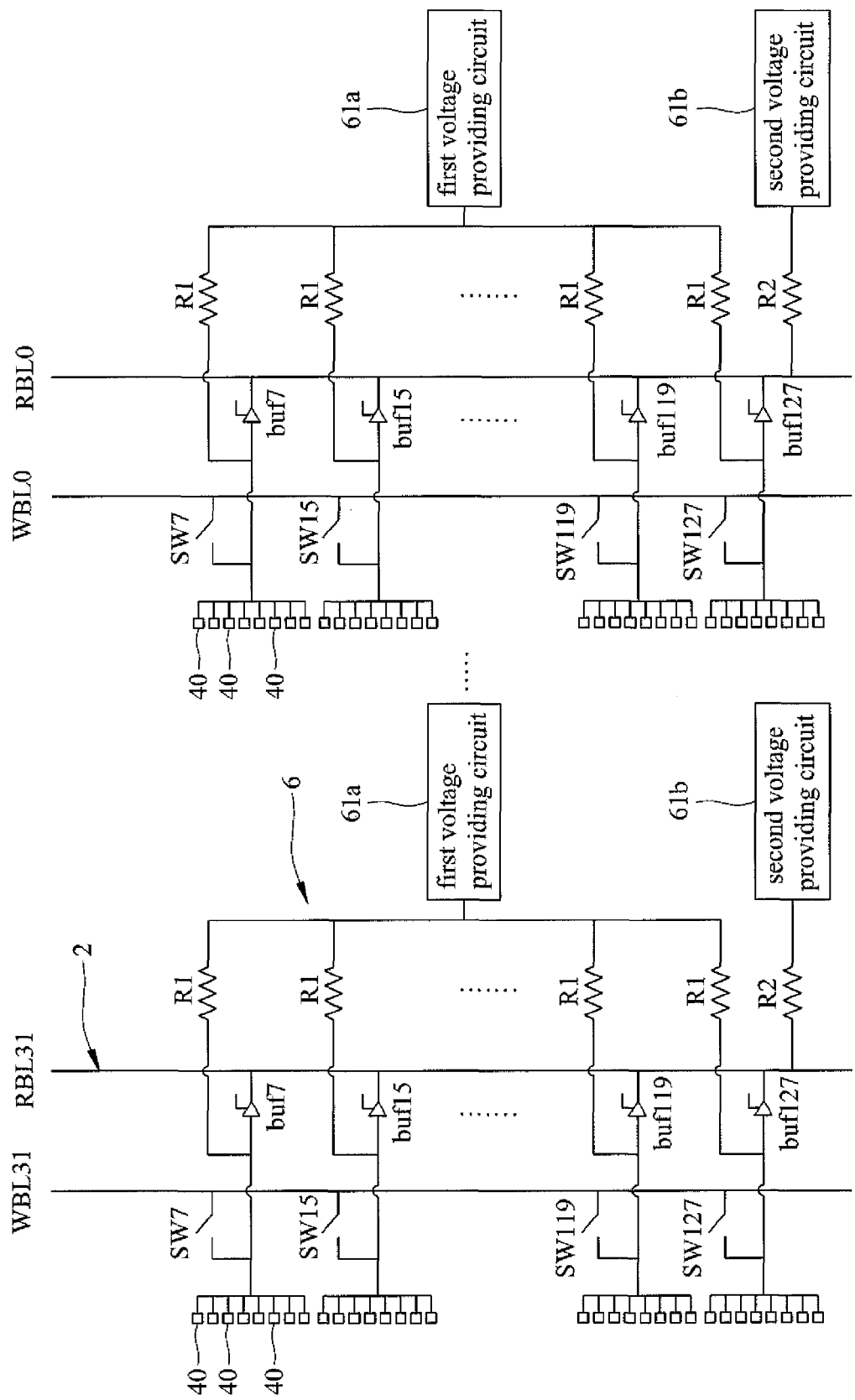
FIG. 9 is a schematic block diagram of a variation of the second preferred embodiment.

FIG. 9 illustrates a variation of the second preferred embodiment. In this variation, each of the buffer switches (SW) is connected between the write bit line (WBL) and the input terminal of a respective one of the tri-state buffers (buf).

In operation, when data is to be written into one of the memory cells 40 (in the write mode), parts of the write bit line (WBL) between the one of the memory cells 40 and the controller must be configured to establish a closed circuit in order for the data to reach the one of the memory cells 40. Alternatively, when data is to be read from one of the memory cells 40 (in the read mode), all the buffer switches (SW) must be open. Also, the bias voltage unit 6 is switched to the non-biasing mode when data is to be read from a selected one of the memory cells 40.

In brief, when 1T-DRAMs are used as the memory cells 40, the second terminals are responsible for both read and write operations. Therefore, the parasitic capacitance on the write bit line (WBL) may adversely affect the capability of the memory cells 40 to drive the tri-state buffers (buf), subsequently reducing the maximum frequency of the memory cells 40.

The buffer switches (SW) are then used to "fragment" the write bit line (WBL). As a result, the parasitic capacitance attributed to the write bit line (WBL) can be reduced to 1/16 compared to the conventional configuration.

The second preferred embodiment has the same advantages as those of the first preferred embodiment.

Figure 10:
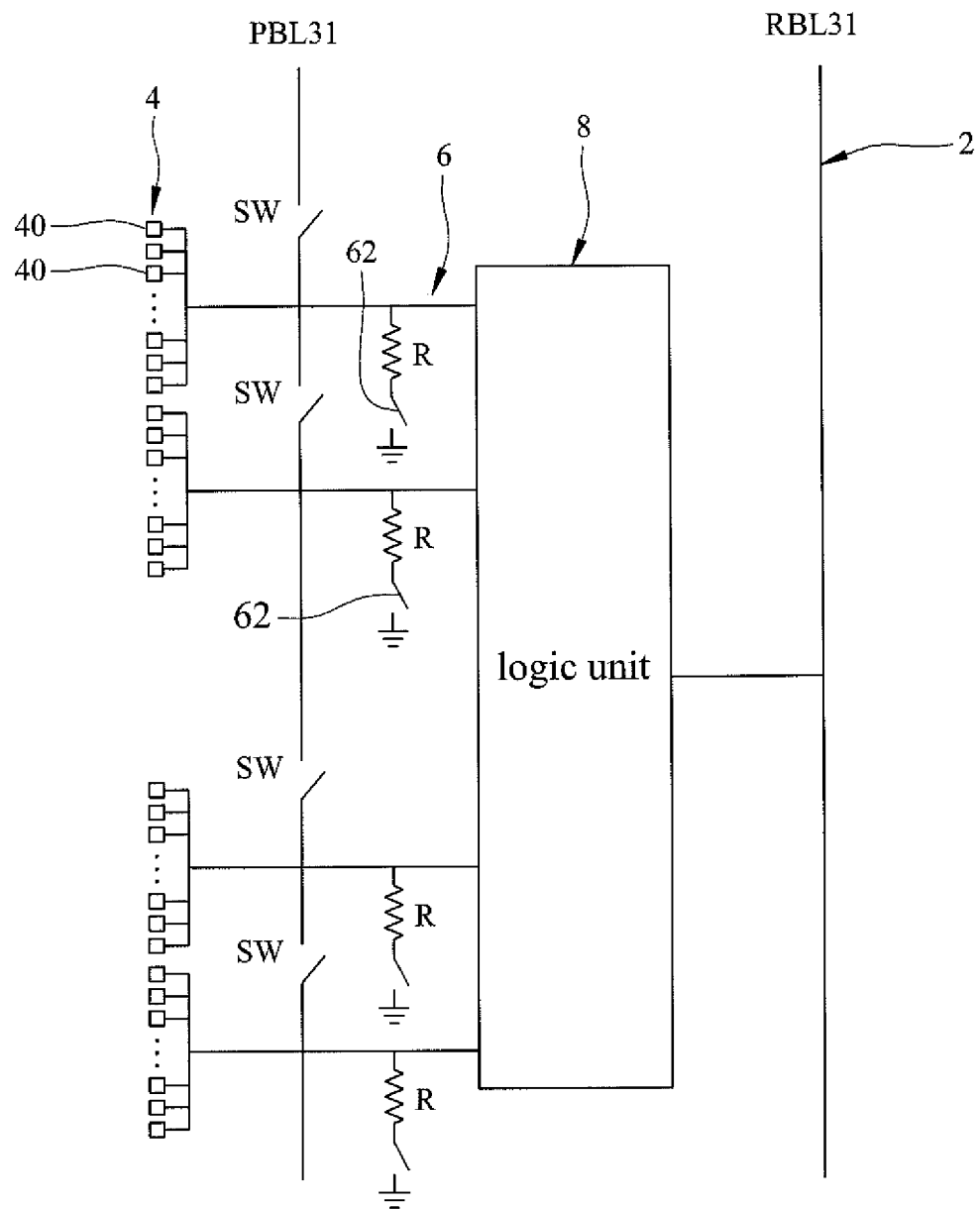
FIG. 10 is a schematic block diagram of the third preferred embodiment of a semiconductor memory device that does not require a sense amplifier, according to the invention.
Figure 11:
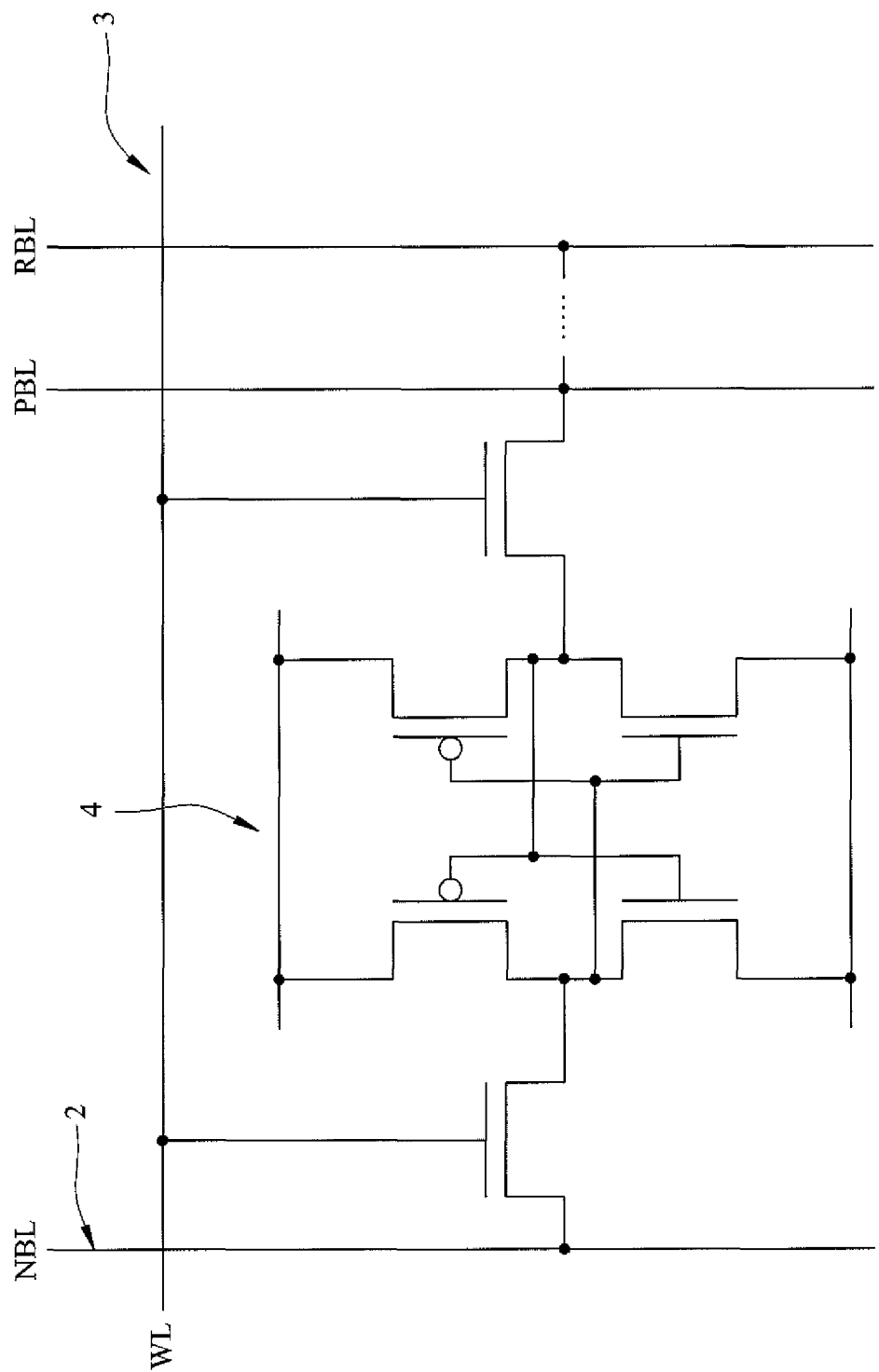
FIG. 11 is a schematic circuit diagram of a memory cell of the semiconductor memory device according to the third preferred embodiment.

As shown in FIGS. 10 and 11, the third preferred embodiment of the semiconductor memory device according to the present invention has a structure similar to that of the second preferred embodiment. The main difference between this embodiment and the second preferred embodiment resides in the following.

In this embodiment, the memory cells 40 are embodied as six-transistor static random access memories (SRAM). As shown in FIG. 11, the write bit line (WBL) of each of the memory cell lines includes a positive write bit line (PBL) and a negative write bit line (NBL). Specifically, the to-be-written data is provided to the memory cells 40 by the positive write bit line (PBL) and the negative write bit line (NBL) as a voltage difference therebetween.

The control line unit 3 includes a plurality of control lines (WL) that are electrically isolated from the read bit line (RBL), the positive write bit line (PBL) and the negative write bit line (NBL). The control lines (WL) are for transmitting the control signal to the memory cells 40 for switching the same between the write mode and the read mode.

The semiconductor memory device further comprises a plurality of logic units 8 each coupled to a respective one of the memory cell lines. Each of the logic units 8 has a plurality of input terminals coupled respectively to the memory cell groups 4, and an output terminal coupled to the read bit line (RBL). Data stored in the memory cells 40 is read through the read bit line (RBL) via the logic unit 8. That is, an output voltage produced by the logic unit 8 is dependent on the data read from the memory cells 40.

The bias voltage unit 6 is coupled to the input terminals of the logic unit 8, and is operable to control supply of a preset bias voltage to the input terminals of the logic unit 8. In this embodiment, the preset bias voltage is a ground voltage, while in other embodiments, the preset bias voltage may be a high voltage level or a low voltage level that is other than the ground voltage.

For each of the memory cell lines, the bias voltage unit 6 includes a plurality of switches 62 and a plurality of resistors (R). It is noted that, in embodiments where the voltage source itself has an equivalent resistance (e.g., being other than a ground), the resistors (R) may be omitted.

The switches 62 are coupled to a voltage source that provides the preset bias voltage. The resistors (R) are coupled respectively between one of the input terminals of the logic unit 8 and one of the switches 62. The switches 62 are closed when the bias voltage unit 6 operates in the biasing mode, and are open when the bias voltage unit 6 operates in the non-biasing mode. That is, when the bias voltage unit 6 operates in the biasing mode, the preset bias voltage is supplied to the input terminals of the logic unit 8. When the bias voltage unit 6 operates in the non-biasing mode, the preset bias voltage is not supplied to the input terminals of the logic unit 8.

As shown in FIG. 11, in operation, when data is to be written into one of the memory cells 40 (in the write mode), data is fed to the memory cell 40 through both the positive write bit line (PBL) and the negative write bit line (NBL), and is subsequently stored in a parasitic capacitor of the memory cell 40. Alternatively, when data is to be read from one of the memory cells 40 (in the read mode), the bias voltage unit 6 is switched to the non-biasing mode. Additionally, the switches 62 are opened, such that a case in which the to-be read data is an inverted form of the preset bias voltage is prevented, thus reducing unnecessary power dissipation attributed to electrical current flowing through the resistors (R).

Then, data stored in the memory cell 40 can be read through the read bit line (RBL) via the logic unit 8. Since operations of a 6T-SRAM may be readily appreciated by those skilled in the art, details thereof are omitted herein for the sake of brevity.

In other embodiments where power dissipation is not a critical factor, the switches 62 may be omitted. That is, the resistors (R) are directly coupled to the voltage source, and the bias voltage unit 6 always provides the preset bias voltage. In this case, the resistors (R) may be configured to have a relatively large resistance to reduce the current flowing therethrough.

In this embodiment, the data read from the memory cells 40 have an identical phase as those transmitted to the read bit lines (RBL). Therefore, the semiconductor memory device of this embodiment does not require the inverters 7 of the semiconductor memory device of the first preferred embodiment.

In some embodiments, the read bit line (RBL) may include a positive read bit line and a negative write bit line for obtaining the to-be-read data as a voltage difference therebetween.

The logic unit 8 may be implemented in a number of ways. For example, in a variation illustrated in FIG. 12, the logic unit 8 includes a plurality of OR gates 81. Accordingly, the resistors (R) in this variation serve as pull-down resistors, and the preset bias voltage is a ground voltage. Alternatively, in a variation illustrated in FIG. 13, the logic unit 8 includes a plurality of AND gates 82. Accordingly, the resistors (R) in this variation serve as pull-up resistors, and the preset bias voltage is a high level voltage (Vcc). The output voltage produced by the logic unit 8 is therefore dependent on the data read from the memory cells 40.

Figure 12:
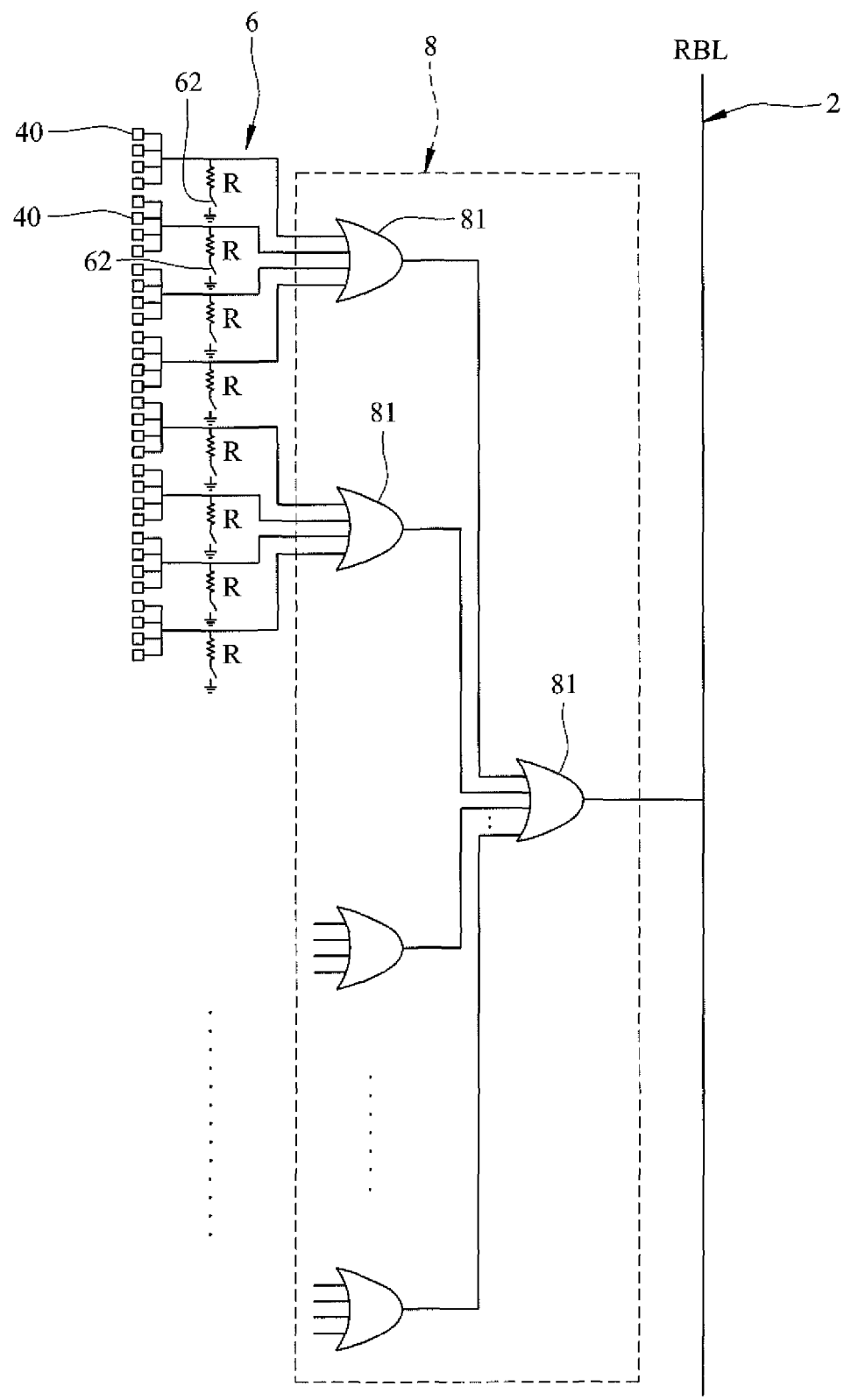
FIG. 12 is a schematic circuit diagram of a logic unit of the semiconductor memory device according to the third preferred embodiment.
Figure 13:
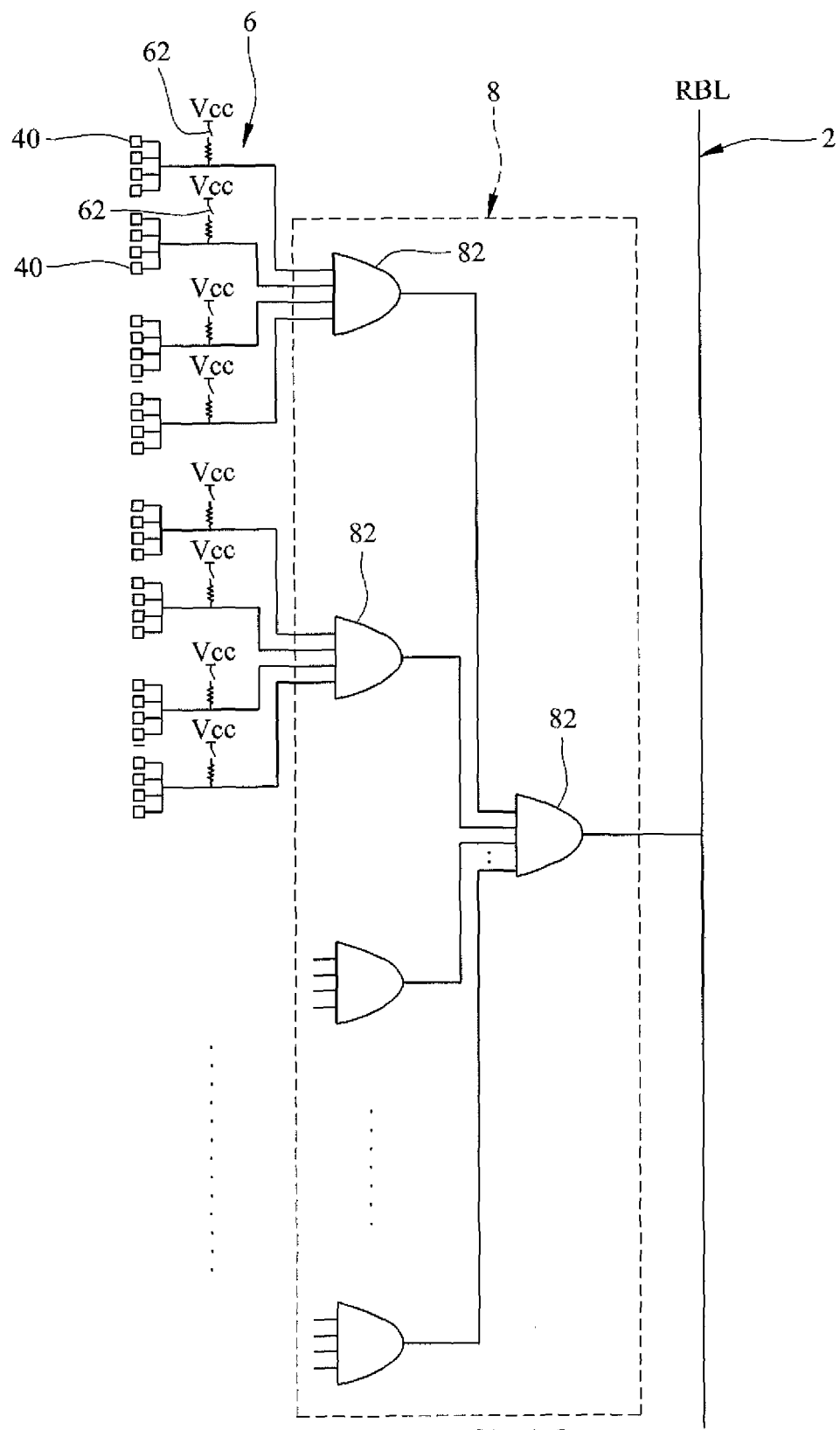
FIG. 13 is a schematic circuit diagram of a logic unit of the semiconductor memory device, according to a variation of the third preferred embodiment.

For example, in the variation of FIG. 12, initially all the input terminals of the OR gates 81 receive the ground voltage, thus outputting the ground voltage to the read bit line (RBL). When a selected one of the memory cells 40 has the to-be-read data that has a high level voltage, the high level voltage is transmitted through the OR gates 81 to the read bitline (RBL). In the variation of FIG. 13, initially all the input terminals of the AND gates 82 receive the high level voltage (Vcc), thus outputting the high level voltage (Vcc) to the read bit line (RBL). When a selected one of the memory cells 40 has the to-be-read data that has a low level voltage, the low level voltage is transmitted through the AND gates 82 to the read bit line (RBL).

In this embodiment, each of the memory cell groups 4 includes 16 memory cells 40. Accordingly, the OR gates 81 and the AND gates 82 may be 16-to-1 logic gates. However, in other embodiments, various configurations may be employed.

In this embodiment, the logic unit 8 serves to assist driving of the read bit line (RBL), and the switches 62 are open when data is to be read from the memory cells 40. Such a configuration allows the third preferred embodiment to have the same advantages as those of the second preferred embodiment.

In an embodiment, there is provided a semiconductor memory device that does not require a sense amplifier. The semiconductor memory device is configured for use in a system having a system clock and a voltage source that provides a high voltage and a low voltage. The semiconductor memory device comprises a memory cell array including a memory cell group, a data line unit coupled to the memory cell group, a control unit electrically isolated from the data line unit for transmitting a control signal, and a bias voltage unit. The bias voltage unit is coupled to a junction of the memory cell group and the read bit line, and is operable to control supply of a preset bias voltage to the junction.

The semiconductor memory device may be configured such that a time constant of the read bit line is smaller than that required by system clock.

The semiconductor memory device may be configured such that amplitude of a signal read through the read bit line corresponds in magnitude to a difference between the high voltage and the low voltage.

To sum up, embodiments of the present invention eliminate the need to incorporate a sense amplifier into the semiconductor memory device, thus reducing the power consumption thereof. Various types of memory cells may be used without compromising the effect of the present invention. In addition, the maximum frequency under which the semiconductor memory device can operate may be increased.

In this disclosure, the term "coupled to" should not be restricted to a mechanical or physical coupling based on an inference from the written description, but could include electrical coupling.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A semiconductor memory device that does not require a sense amplifier, said semiconductor memory device comprising:
    a data line unit that includes a plurality of spaced-apart and mutually electrically isolated data lines for transmitting read data and write data;
    a control line unit that includes a plurality of spaced-apart and mutually electrically isolated control lines, each of which is for transmitting a control signal and is electrically isolated from said data lines;
    a memory cell array including a plurality of memory elements, each of said memory elements is respectively connected to a data line and a control line and is configured to be controlled by a control signal to receive the write data or to output the read data;
    a tri-state buffer unit including a plurality of tri-state buffers, each of said tri-state buffers having an input terminal coupled to at least one of said memory elements, and an output terminal coupled to a respective one of said data lines of said data line unit, said tri-state buffers being controlled to switch between a conducting state and a non-conducting state; and
    a bias voltage unit coupled to said input terminal of each of said tri-state buffers to supply a preset bias voltage to said input terminals of said tri-state buffers.

2. The semiconductor memory device of claim 1, wherein:
    said bias voltage unit is operable to switch between a biasing mode, in which the preset bias voltage is supplied to said input terminals of said hi-state buffers, and a non-biasing mode, in which the preset bias voltage is not supplied to said input terminals of said tri-state buffers; and
    said bias voltage unit is switched to the non-biasing mode when data is to be read from said memory elements.

3. The semiconductor memory device of claim 2, wherein said bias voltage unit includes:
    a first voltage providing circuit coupled to said input terminals of said tri-state buffers for providing the preset bias voltage thereto in the biasing mode, and for not providing the preset bias voltage thereto in the non-biasing mode; and
    a second voltage providing circuit coupled to said data line unit for providing the preset bias voltage thereto in the biasing mode, and for not providing the preset bias voltage thereto in the non-biasing mode.

4. The semiconductor memory device of claim 2, wherein said bias voltage unit includes a first switch for coupling said input terminal of one of said tri-state buffers to a voltage source that provides the preset bias voltage, and a second switch for coupling said data line unit to the voltage source; said first switch and said second switch are closed when said bias voltage unit operates in the biasing mode, and are open when said bias voltage unit operates in the non-biasing mode.

5. The semiconductor memory device of claim 1, wherein said bias voltage unit includes a first resistor coupled between said input terminal of one of said tri-state buffers and a voltage source that provides the preset bias voltage, and a second resistor coupled between said data line unit and the voltage source.

6. The semiconductor memory device of claim 1, further comprising a plurality of buffer switches connected in series on said data line unit, wherein a common node of every adjacent pair of said buffer switches is connected to a respective one of said memory elements;
    wherein each of said buffer switches includes a first terminal coupled to said data line unit for receiving the to-be-written data, and a second terminal coupled to at least one of said memory cells.

7. The semiconductor memory device of claim 6, wherein:
    said bias voltage unit is able, with respect to each of said tri-state buffers, to switch between a biasing mode, in which the preset bias voltage is supplied to said input terminal of said tri-state buffer, and a non-biasing mode, in which the preset bias voltage is not supplied to said input terminal of said tri-state buffer;
    said bias voltage unit is switched to the non-biasing mode when data is to be read from a selected one of said memory elements;
    said common node of every adjacent pair of said buffer switches is further connected to said bias voltage unit; and
    said bias voltage unit is switched to the non-biasing mode when data is to be written into a selected one of said memory elements.

8. The semiconductor memory device of claim 1, wherein said data line unit further includes a write bit line for transmitting to-be-written data, said semiconductor memory device further comprising a plurality of buffer switches, each connecting said write bit line to at least one of said memory cells;
    wherein each of said buffer switches includes a first terminal coupled to said data line unit for receiving the write data, and a second terminal coupled to at least one of said memory cells.

9. The semiconductor memory device of claim 8, wherein:
    said bias voltage unit is operable, with respect to each of said tri-state buffers, to switch between a biasing mode, in which the preset bias voltage is supplied to said input terminal of said tri-state buffer, and a non-biasing mode, in which the preset bias voltage is not supplied to said input terminal of said tri-state buffer;
    said bias voltage unit is switched to the non-biasing mode when data is to be read from a selected one of said memory elements;
    each of said buffer switches is connected between said write bit line and said bias voltage unit; and
    said bias voltage unit is switched to the non-biasing mode when data is to be written into a selected one of said memory elements.

10. The semiconductor memory device of claim 1, wherein said data line unit includes:
    a plurality of read bit lines coupled to said memory cell array for transmitting the to be read data therefrom; and
    a plurality of write bit lines coupled to said memory cell array for transmitting the write data therefrom; and
    wherein each of said tri-state buffers is coupled between one of said read bit lines and a respective one of said memory elements, and has an input terminal coupled to said at least one memory cell of a respective one of said memory elements, and an output terminal coupled to a respective one of said read bit lines.

11. The semiconductor memory device of claim 10, wherein, the control signal includes a read control signal and a write control signal, said control unit includes:
    a plurality of read word lines configured to transmit the read control signal to said memory elements;
    a plurality of write word lines configured to transmit the write control signal to said memory elements; and each of said memory elements is controlled by the read control signal to be readable/non-readable, and is controlled by the write control signal to be writeable/non-writeable.

12. The semiconductor memory device of claim 1, wherein said memory cells are static random access memories.

13. A semiconductor memory device that does not require a sense amplifier, said semiconductor memory device comprising:
    a memory cell array including a plurality of memory elements, each of said memory elements including at least one memory cell;
    a data line unit that is coupled to said memory elements and that includes a plurality of spaced-apart and electrically isolated data lines for transmitting to-be-read data and to-be-written data;
    a control unit that includes a plurality of spaced-apart and mutually electrically isolated lines, each of which is electrically isolated from said data line unit, and that is for transmitting a control signal and is electrically isolated from said data lines;
    a logic unit having a plurality of input terminals, each coupled to at least one memory cell, and an output terminal coupled to said data line unit, wherein data stored in said memory elements is read through said data line unit via said logic unit when read data outputted from the memory element electrically connected to the logic unit changes, read data outputted to said signal electrode is also changed; and
    a bias voltage unit coupled to each of said input terminals of said logic unit to supply a preset bias voltage to said input terminals of said logic unit.

14. The semiconductor memory device of claim 13, wherein:
    said bias voltage unit is operable to switch between a biasing mode, in which the preset bias voltage is supplied to said input terminals of said logic unit, and a non-biasing mode, in which the preset bias voltage is not supplied to said input terminals of said logic unit; and
    said bias voltage unit is switched to the non-biasing mode when data is to be read from said memory elements.

15. The semiconductor memory device of claim 14, wherein said bias voltage unit includes a voltage providing circuit coupled to said input terminals of said logic unit for providing the preset bias voltage thereto in the biasing mode and for not providing the preset bias voltage thereto in the non-biasing mode.

16. The semiconductor memory device of claim 14, wherein said bias voltage unit includes a switch for coupling one of said input terminals of said logic unit to a voltage source that provides the preset bias voltage;
    said switch is closed when said bias voltage unit operates in the biasing mode, and is open when said bias voltage unit operates in the non-biasing mode.

17. The semiconductor memory device of claim 14, wherein said bias voltage unit includes a resistor coupled between one of said input terminals of said logic unit and a voltage source that provides the preset bias voltage.

18. The semiconductor memory device of claim 13, wherein said data line unit includes:
    a plurality of read bit lines coupled to said memory cell array for transmitting the read data therefrom; and
    a plurality of write bit lines coupled to said memory cell array for transmitting the write data therefrom; and
    wherein said semiconductor memory device comprises a plurality of logic units, each coupled between one of said read bit lines and a respective one of said memory elements for receiving the read data from said respective one of said memory elements and providing the read data to said one of said read bit lines.

19. The semiconductor memory device of claim 18, further comprising a plurality of buffer switches connected in series on said write bit lines, wherein each of said buffer switches includes a first terminal coupled to one of said write bit lines for receiving the write data, and a second terminal coupled to at least one of said memory cells.

20. The semiconductor memory device of claim 19, wherein:
   said bias voltage unit is operable, with respect to each of said input terminals of said logic units, to switch between a biasing mode, in which the preset bias voltage is supplied to said input terminals of said logic units, and a non-biasing mode, in which the preset bias voltage is not supplied to said input terminals of said logic units;
   said bias voltage unit is switched to the non-biasing mode when data is to be read from a selected one of said memory elements;
   said common node of every adjacent pair of said buffer switches is connected to said bias voltage unit; and
   said bias voltage unit is switched to the non-biasing mode when data is to be written into a selected one of said memory elements.

21. The semiconductor memory device of claim 18, further comprising a plurality of buffer switches, each connecting one of said write bit lines to a respective one of said memory elements, wherein each of said buffer switches includes a first terminal coupled to one of said write bit fines for receiving the to-be-written data, and a second terminal coupled to at least one of said memory cells.

22. The semiconductor memory device of claim 21, wherein:
   said bias voltage unit is able, with respect to each of said input terminals of said logic units, to switch between a biasing mode, in which the preset bias voltage is supplied to said input terminals of said logic units, and a non-biasing mode, in which the preset bias voltage is not supplied to said input terminals of said logic units;
   said bias voltage unit is switched to the non-biasing mode when data is to be read from a selected one of said memory elements;
   each of said buffer switches is connected between said data line unit and a respective one of said input terminals of said logic units; and
   said bias voltage unit is switched to the non-biasing mode when data is to be written into a selected one of said memory elements.

23. The semiconductor memory device of claim 18, wherein, the control signal includes a read control signal and a write control signal, said control unit including:
   a plurality of read word lines configured to transmit the read control signal to said memory cells groups;
   a plurality of write word lines configured to transmit the write control signal to said memory elements; and
   each of said memory elements is controlled by the read control signal to be readable/non-readable, and is controlled by the write control signal to be writeable/non-writeable.

24. The semiconductor memory device of claim 13, wherein said memory cells are static random access memories.

25. The semiconductor memory device of claim 13, wherein said logic unit includes at least one OR gate.

26. The semiconductor memory device of claim 13, wherein said logic unit includes at least one AND gate.

27. A semiconductor memory device that does not require a sense amplifier, said semiconductor memory device being configured for use in a system having a system clock and a voltage source that provides a high voltage and a low voltage, said semiconductor memory device comprising:
   a memory cell array including a plurality of memory elements, each of said memory elements being respectively connected to a data line and a control line and is configured to be controlled by a control signal to receive the write data or to output the read data;
   a data line unit coupled to said memory elements, said data line unit including a plurality of spaced-apart and mutually electrically isolated data lines for transmitting to-be-read data and to-be-written data;
   a control unit that includes a plurality of spaced-apart and mutually electrically isolated lines, each of which is electrically isolated from said data line unit, and that is for transmitting a control signal and is electrically isolated from said data lines; and
   a bias voltage unit coupled to a junction of said memory elements and said data line unit and operable to control supply of a preset bias voltage to said junction;
      wherein said data line unit is configured such that a time constant thereof is smaller than that required by the system clock; and
      wherein amplitude of a signal read through said data line unit corresponds in magnitude to a difference between the high voltage and the low voltage.

* * * * *